United States Patent
Kasapi et al.

(10) Patent No.: US 6,252,222 B1
(45) Date of Patent: Jun. 26, 2001

(54) DIFFERENTIAL PULSED LASER BEAM PROBING OF INTEGRATED CIRCUITS

(75) Inventors: Steven A. Kasapi, San Francisco; Chun-Cheng Tsao, Cupertino; Seema Somani, San Jose, all of CA (US)

(73) Assignee: Schlumberger Technologies, Inc., San Jose, CA (US)

( * ) Notice: Subject to any disclaimer, the term of this patent is extended or adjusted under 35 U.S.C. 154(b) by 0 days.

(21) Appl. No.: 09/483,463

(22) Filed: Jan. 13, 2000

(51) Int. Cl.[7] ..................... G01R 31/265; G01R 31/308
(52) U.S. Cl. .................. 250/214 R; 324/96; 324/752
(58) Field of Search .................... 250/214 R, 225, 250/340, 341.1, 341.2, 341.3, 341.4, 341.8; 324/96, 97, 612, 613, 614, 615, 616, 750, 752, 753

(56) References Cited

U.S. PATENT DOCUMENTS

| | | |
|---|---|---|
| 4,683,420 * | 7/1987 | Goutzoulis ........................ 324/96 |
| 4,758,092 | 7/1988 | Heinrich et al. .................... 356/364 |
| 5,847,570 * | 12/1998 | Takahashi et al. .................. 324/753 |
| 5,872,360 | 2/1999 | Paniccia et al. ................. 250/341.4 |
| 5,905,577 | 5/1999 | Wilsher et al. ..................... 356/448 |
| 6,114,858 * | 9/2000 | Kasten ................................. 324/616 |

* cited by examiner

Primary Examiner—John R. Lee
(74) Attorney, Agent, or Firm—Skjerven Morrill MacPherson LLP; Norman R. Klivans; Mark E. Schmidt

(57) ABSTRACT

A laser beam is used to probe an integrated circuit device under test. A single laser provides a single laser pulse which is divided into two pulses, both of which are incident upon the device under test. After the two pulses interact with the device under test, the two pulses are separated and detected by two photo detectors. The electrical signals output by the photo detectors are then subtracted, which cancels out any common mode noise induced on both pulses including noise due to mechanical vibration of the device under test and also any noise from the laser. The difference signal can be used to reproduce a time varying signal in the device under test.

26 Claims, 6 Drawing Sheets

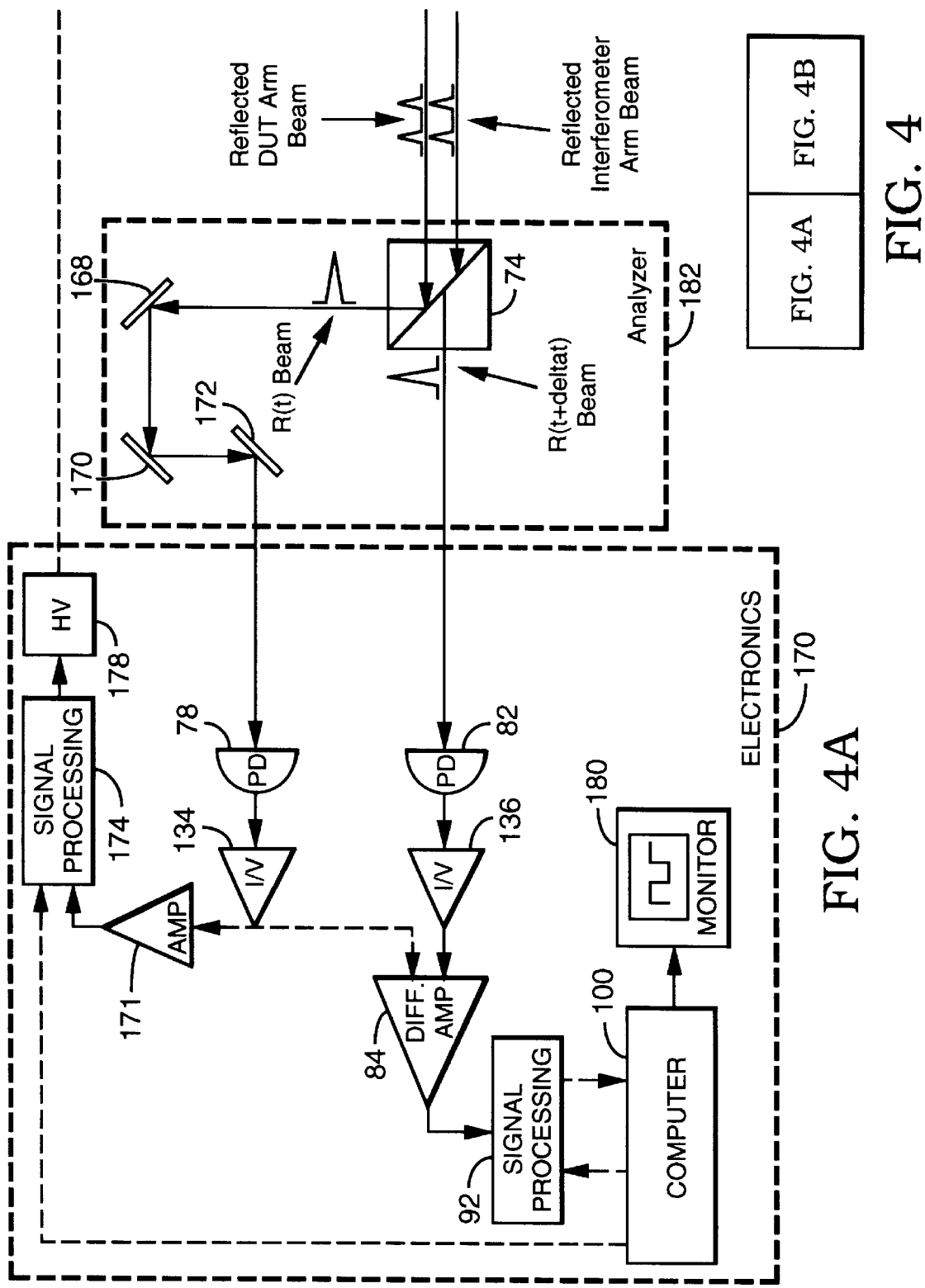

DIFFERENTIAL PULSED LASER BEAM PROBING OF INTEGRATED CIRCUITS

FIELD OF THE INVENTION

This invention relates to probing of integrated circuit devices with a laser beam.

DESCRIPTION OF RELATED ART

Paniccia et al. U.S. Pat. No. 5,872,360 issued Feb. 16, 1999 and incorporated herein by reference, discloses (see Abstract) a method and apparatus for detecting an electric field in the active regions of an integrated circuit disposed. In one embodiment, a laser beam is provided at a wavelength near the band gap of the integrated circuit semiconductor material such as silicon. The laser beam is focused into a P-N junction such as, for example, the drain region of a MOS transistor. When an external electric field is impressed on the P-N junction such as when, for example, the drain region of the transistor switches, the degree of photo-absorption will be modulated in accordance with the modulation in the electric field due to the phenomena of electro-absorption. Electro-absorption also leads to electro-refraction which leads to a modulation in the reflection coefficient for the laser beam light reflected from the P-N junction/oxide interface.

Wilsher et al. U.S. Pat. No. 5,975,577 issued May 18, 1999 also incorporated herein by reference, discloses dual laser beam probing of integrated circuits. A laser probe beam is used to sample the waveform on an integrated circuit (DUT) during each cycle of an electrical signal test pattern applied to the DUT. For each operating cycle of the test pattern (of the device under test), the probe beam and also a reference laser beam sample the DUT at the same physical location, but at displaced times with respect to each other. Each reference measurement is made at a fixed time relative to the test pattern while the probe measurements are scanned through the test-pattern time portion of interest, in a manner used in equivalent time sampling, to reconstruct the waveform. For each test cycle, the ratio of probe and reference measurements is taken to reduce fluctuations due to noise.

FIG. 6 of Wilsher et al. illustrates a system in which a mode-locked laser source provides the probe pulses. This laser source outputs laser pulses of short time duration with a high frequency laser repetition rate. A reference laser source outputs a laser beam used to form the reference laser pulses. Typically the reference laser source is a continuous wave laser. The laser pulses from the probe laser source and the reference laser source are both optically modulated and guided to a beam combiner by beam deflecting optics. The resulting combined laser pulses are focused through a fiber optic coupler to a laser scanning microscope. Hence, the laser pulses are provided from two separate sources. The resulting combined laser beam is directed onto the DUT, reflected therefrom, and directed onto a photo detector. The probe and reference pulses, which arrive at the photo detector displaced in time, are separately detected and digitized.

Though ratioing reflected probe and reference laser pulses dramatically reduces the sensitivity of the measurement to noise, several factors may limit noise cancellation and prevent the measurement from reaching the shot-noise limit. (Shot noise is the inherent noise in a laser beam.) For example, the modulation of the reflected amplitude of a laser pulse due to electrical activity in the DUT is small compared to the total reflected amplitude. Thus, the modulated signal of interest rides on a large DC offset, which severely limits the effective dynamic range with which the modulated signal is digitized. Also, the noise on the reference and probe laser pulses, which may differ in wavelength, may be imperfectly correlated due to wavelength dependent interactions with the DUT as well as due to the displacement in time between the pulses.

What is needed is an optical probe of integrated circuits less subject to noise.

SUMMARY

The present method and apparatus are directed to, as described above, measuring electrical activity in an integrated circuit. Two laser pulses are derived from the same source, which is a single laser in one embodiment. Alternatively, the two pulses may be derived from an incoherent source. The two pulses sample the electrical activity in the integrated circuit, for example, at two times separated by a time delay $\Delta t$, where $\Delta t$ may be zero. The two pulses are then detected separately using suitable identical photo detectors and the resulting two signals are subtracted from each other. The resulting difference cancels out any common mode noise signal, as induced by both mechanical vibration and noise in the amplitude of the beam from the laser source. With suitably accurate photo detectors, the system easily reaches the shot-noise limit set by the number of photons in the laser beam.

Two pulses separated by a nonzero time delay $\Delta t$ probe the electrical activity in the DUT at different times. If the two pulses interact with the DUT with similar interaction strengths, the resulting difference signal is proportional to the derivative of the waveform that would have been produced with a single pulse probing approach.

Two pulses coincident in time ($\Delta t=0$) sample the electrical activity in the DUT at the same time. If the pulses interact with the DUT with similar interaction strengths, the resulting difference signal is zero. A nonzero difference signal will result if the pulses interact with the DUT with different interaction strengths. For example, if the two pulses are of orthogonal linear polarizations and the interactions with the DUT are polarization dependent, the resulting difference signal is proportional to the waveform that would have been produced with a single pulse probing approach, but reaches the shot-noise limit. The difference in interaction with the DUT of two pulses of different wavelength may similarly be exploited.

DETAILED DESCRIPTION

A single pulsed laser is used to probe integrated circuits with shot-noise limited sensitivity. A single laser pulse provides two laser pulses. Before interacting with a sample device under test (DUT), the two laser pulses have identical noise because they are derived from the same laser pulse. After interacting with the DUT, the laser pulses have additional noise introduced by any vibration of the DUT, but again the noise of the two pulses is correlated because the time difference between the two pulses is very short. Consequently, the difference signal between the photo current signals induced by each of the pulses in associated photo detectors does not contain any excess laser induced noise or vibration (from the DUT) induced noise. The remaining noise is shot-noise limited if the photo detectors and associated amplifiers are sufficiently low noise and sufficiently matched. A single detector and amplifier may be used with a delay circuit if the detector and amplifier have sufficiently fast response times. The difference signal is the difference between the interaction of the first probe pulse with the DUT and the interaction of the second probe pulse with the DUT. Various well known methods can be used to reproduce a time-varying signal from the difference signal.

Figure 1:
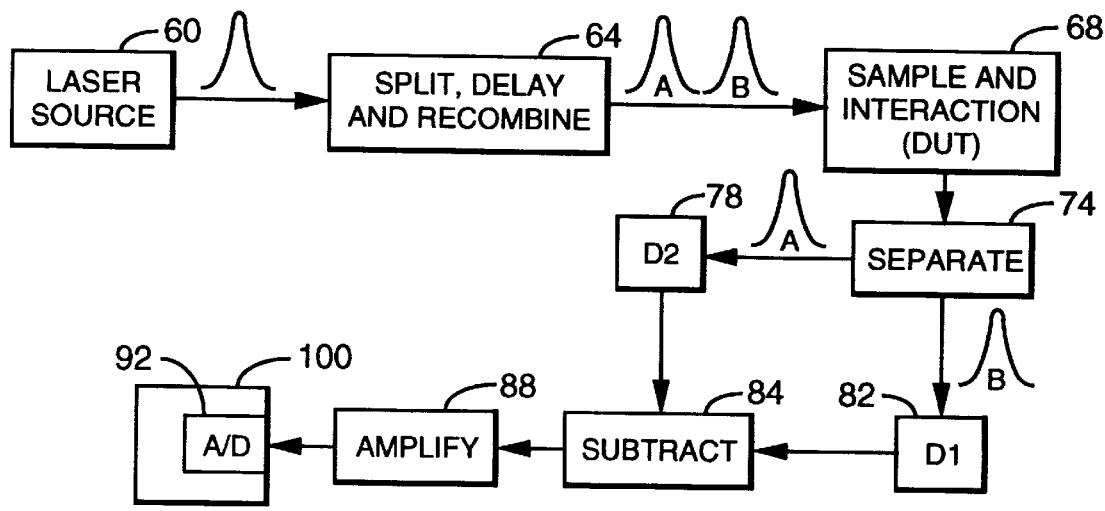
FIG. 1 shows a block diagram of an apparatus in accordance with this invention.

FIG. 1 shows in a block diagram an apparatus in accordance with one embodiment. A light source 60 which includes a laser outputs a series of pulses. Alternatively, the pulses are output from an incoherent light source such as a light emitting diode or a lamp. Each pulse is then split into two pulses in block 64 and the two pulses are time delayed relative to each other and recombined optically. Detail of this is given below. The two pulses, labeled pulses A and B, typically have a slight time delay between them. Pulses A and B then interact with the DUT 68. After interacting with the DUT 68, the two pulses are then optically separated by separator element 74 into pulses A and B again. Separator element 74 spatially separates the two pulses A and B, directing them to different detectors. Pulse A is applied to (first) detector D2 78 and pulse B is applied to (second) detector D1 82; these are conventional photo detectors. The resulting signals from detectors D1 and D2 are then subtracted at subtractor 84. The difference signal output from subtractor 84 is then amplified by amplifier 88 and applied to an analog to digital converter 92 which is part of a processor (computer) 100 which conventionally processes and outputs the resulting signals to the user. Different portions of the DUT are probed by moving the DUT or by moving the optical assembly relative to the DUT.

Advantageously, any noise induced on both pulses A and B at the DUT 68 is canceled out when the two photo current signals are subtracted by subtractor 84. Any mechanical vibration of the DUT 68 of frequency less than $1/\Delta t$, where $\Delta t$ is the separation in time between the two pulses, is thereby canceled.

This apparatus requires only a single laser source 60 which is preferably a pulsed laser with short pulse duration. The apparatus is insensitive to laser noise and does not require taking a ratio of two signals to cancel noise. This apparatus is intrinsically shot-noise limited because the two pulses A and B are derived from the same laser source 60, and the electrical signal from subtractor 84 is a difference of the electrical signals generated by each of the pulses A and B. The two pulses and the two detectors may be balanced by adjusting pulse energies and detector gain such that there is no DC (direct current) offset in the difference signal when there is no electrical activity in the DUT. The difference signal can be amplified by amplifier 88 so as to take full advantage of the dynamic range of analog to digital converter 92. The two pulse nature of this approach allows one to characterize and possibly to take advantage of any invasiveness of the photo-semiconductor interaction. For example, the first pulse could produce electron-hole pairs in the junction and the second pulse could probe the electron-hole pairs.

Figure 2:
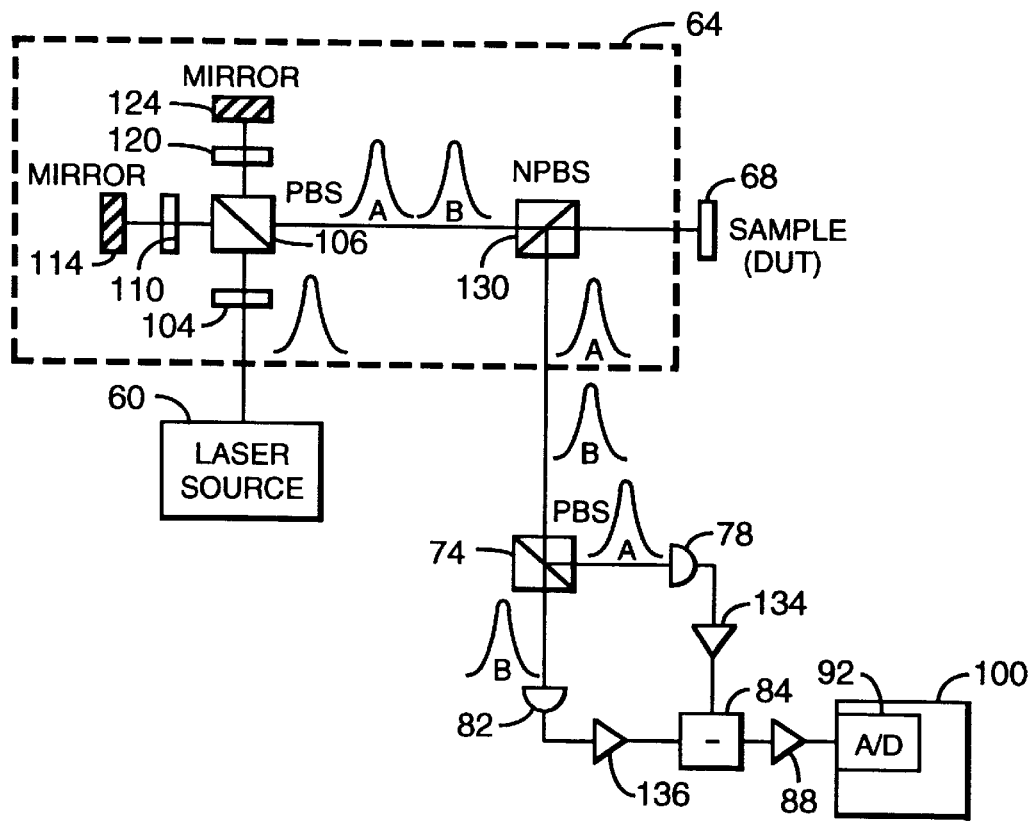
FIG. 2 shows the apparatus of FIG. 1 in greater detail.

FIG. 2 shows an implementation of the FIG. 1 apparatus with identical elements carrying identical reference numbers. In one example, laser source 60 is a mode locked Nd:YAG laser outputting light pulses (a beam) as shown with a pulse width (duration) of approximately 32 ps and with a center wavelength of 1.064 µm. The polarization of the light pulses is rotated by a half wave plate 104 in the splitting optics 64. The pulses are then each split according to its linear polarization by a polarizing beam splitter (PBS) cube 106. In one optical arm, the light beam passes through a quarter wave plate 110 and is reflected from mirror 114. Mirror 114 is adjustable so that after reflection the beam retraces its path. The quarter wave plate 110 is adjusted so that the linear polarization of the beam is rotated by 90° on the return path. On the return path, the beam again passes back through the polarizing beam splitter cube 106.

In the other (delay path) arm of splitter optics 64, the orthogonal polarized light beam passes through another quarter wave plate 120 and reflects from a second mirror 124 which has been adjusted so that the beam retraces its path and its polarization is then rotated by 90°. On the return path, this beam reflects off the polarizing beam splitter cube 106 and combines with the other beam. Mirror 124 can also be adjusted to allow for a path length difference between this arm and the other arm (involving mirror 114). When the two pulses A and B are combined, the time delay $\Delta t$ between them can thus be controlled by moving mirror 124. Typically this movement is in the vertical direction in the plane of the figure. The time delay $\Delta t$ is zero if the path lengths of the two arms are the same.

Pulses A and B subsequently propagate along the exact same path as shown from polarizing beam splitter 106. Pulses A and B then pass through non-polarizing beam splitter (NPBS) cube 130. They then interact as shown with the DUT (sample) 68 and are reflected from the DUT. The pulses A and B are then reflected back by non-polarizing beam splitter cube 130 and then separated back into pulses A and B by separator element 74 which in this case is a polarizing beam splitter cube.

Pulse A is then detected by photo detector 78 and pulse B is detected by photo detector 82 as in FIG. 1. Photo detectors 78 and 82 are, e.g., New Focus model 2001 200 kHz bandwidth photoreceivers supplied by New Focus, Inc. of Santa Clara, Calif. Downstream of the photo detectors 78 and 82, of course, the signal is electrical rather than optical. The electrical signal output by detector 78 is amplified by amplifier 134 and the output signal from detector 82 is amplified by amplifier 136. The two amplified signals are then subtracted by subtractor 84 and, as in FIG. 1, the difference signal is input to analog to digital converter 92.

Alternatively, pulses A and B are propagated through the DUT 68, reflected back through the DUT 68 by a reflective optic to non-polarizing beam splitter cube 130, and then directed to detectors 78 and 82. The pulses may also be propagated through DUT 68, separated by a separating element, and directed to detectors 78 and 82.

The photo current detected by each of the photo detectors 78 and 82 contains both the desired signal and whatever noise is present on the laser pulses. This noise may come from vibration of the DUT 68 or noise on the laser pulses output by the laser source 60. The subtractor (difference circuit) 84 cancels out common noise between the two pulses whatever its source, leaving only the intrinsic shot-noise fluctuations. Typically computer 100 provides graphic or other displays of the difference signal to the user, the display being of the conventional type.

A modification to the FIG. 2 apparatus involves measuring the differential phase shift between the two pulses A and B, caused by electrical activity in the DUT, by adding an interferometer to the optical portion of the system. A simplified depiction of the differential phase shift measuring apparatus is illustrated in FIG. 3, which contains elements essentially identical to those of FIG. 2 with addition of the interferometer.

The interferometer includes an additional non-polarizing beam splitter (NPBS) cube 139 which partially transmits both pulses A and B and partially reflects them as reference pulses A' and B'. Non-polarizing beam splitter cube 130 also partially transmits both pulses A and B. Pulses A and B interact with the DUT 68 as before and are reflected back where they are partially reflected off the second non-polarizing beam splitter cube 130 as before. Reflected pulses A" and B" as shown are combined with the reference pulses A' and B' by an additional non-polarizing beam splitter cube 144 by reflecting pulses A' and B' from mirror 141. Mirror 141 can be adjusted with a piezoelectric element (not shown) such that the set of pulses A" and B" and the set of pulses A' and B' interfere with each other to achieve the interferometry effect. This requires that pulses A" and A' overlap in space at time at one detector and that pulses B" and B' overlap in space and time at the other detector. The half wave plate 140 performs the function of adjusting the polarization of reference pulses A' and B' to compensate for any residual polarization dependence of the NPBS 144. The remainder of the apparatus is identical to that of FIG. 2.

Figure 3:
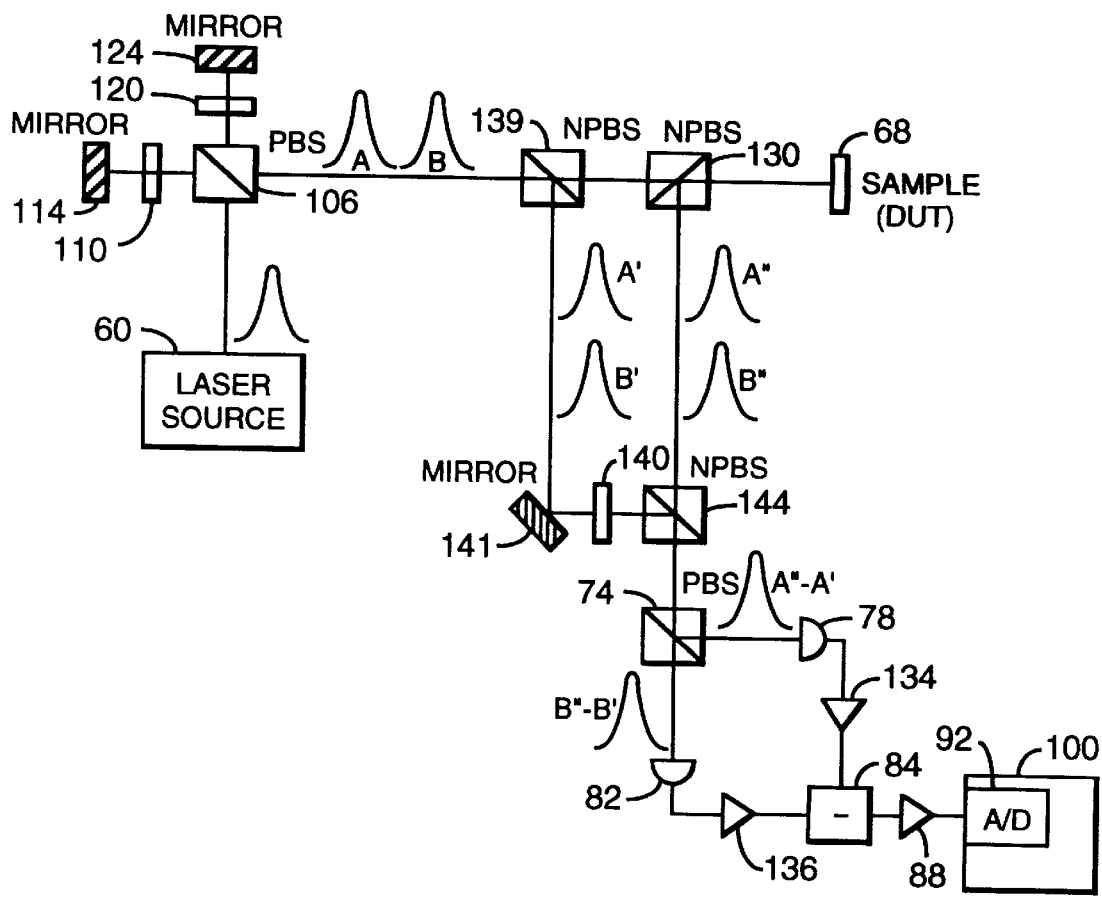
FIG. 3 shows a further embodiment of the FIG. 2 apparatus.
Figure 4B:
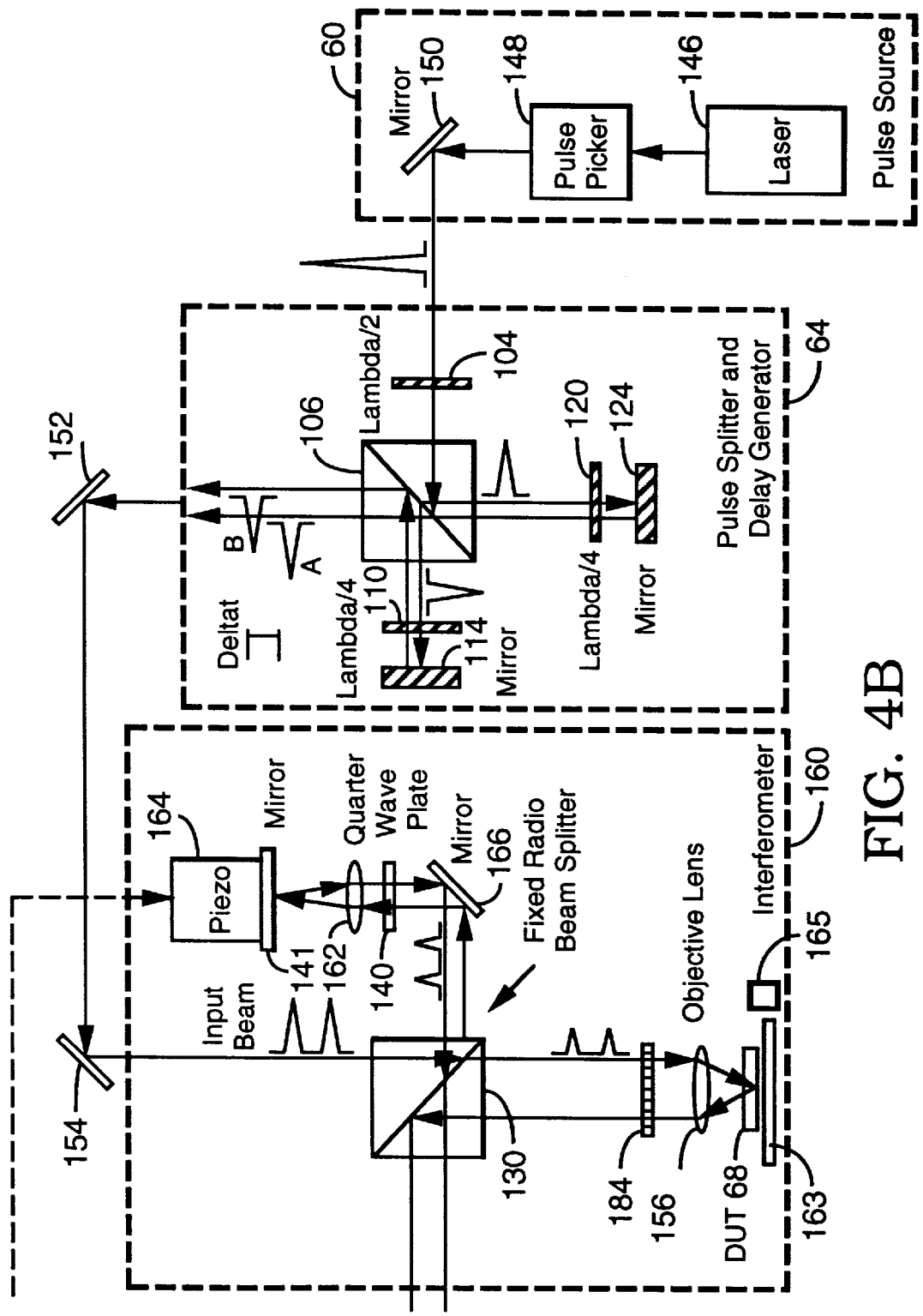
FIG. 4 shows greater detail of the FIG. 3 apparatus.

FIG. 4 shows greater detail of the differential phase shift measuring system depicted in simplified form in FIG. 3. FIG. 4 depicts elements not present in FIG. 3. Beam splitter 130 both splits and recombines, so beam splitters 139 and 144 of FIG. 3 are not needed. In FIG. 4 the laser source 60 includes the actual laser 146, a pulse picker 148, and a mirror 150 to fold the optical path for convenience. Block 60 outputs the laser pulse as shown. The pulse splitter and delay generator 64 includes the same elements as in FIG. 2 and FIG. 3. (Note that for convenience of depiction, the pulses are shown as sharp peaks in FIG. 4 rather than rounded as in FIG. 3. Of course, rounded peaks better represent the actual laser pulses.) The induced pulse delay Δt is illustrated graphically in block 64 as being between pulses A and B.

Pulses A and B are reflected from mirrors 152 and 154, for convenience in terms of the optical path. In this case, an objective lens 156 is immediately upstream of the DUT 68. The interferometer depicted in simplified form in FIG. 3 is shown in greater detail in block 160. In the interferometer there is an objective lens 162, and a piezoelectric drive 164 for positioning mirror 141. There is also reference path folding mirror 166 for convenience. The objective lens 162 adjusts the collimation of the interferometer reference arm to match the collimation of the DUT arm. Note that an optional DUT x-y supporting stage 163 is shown in FIG. 4, with its associated drive 165.

Downstream of the interferometer and associated with polarizing beam splitter 74, mirrors 168, 170, 172 are for purposes of convenience of the optical path. Also, in the electronics portion 170, in addition to the elements described above, there is a feedback loop including amplifier 171, signal processing circuitry 174, and high voltage amplifier 178 providing a feedback signal as shown by the dotted lines coupled to the piezoelectric drive 164 controlling the position of mirror 141 in the interferometer reference arm. This feedback loop stabilizes the interferometer by adjusting the reference path length to compensate for variations in the path length of the DUT arm due to vibration of the DUT, for example. Also in electronics portion 170 is a monitor 180 conventionally associated with computer 100 for displaying the output signal. In this case, the polarizing beam splitter 74 is considered to be part of an analyzer optical portion 182.

Figure 5A:
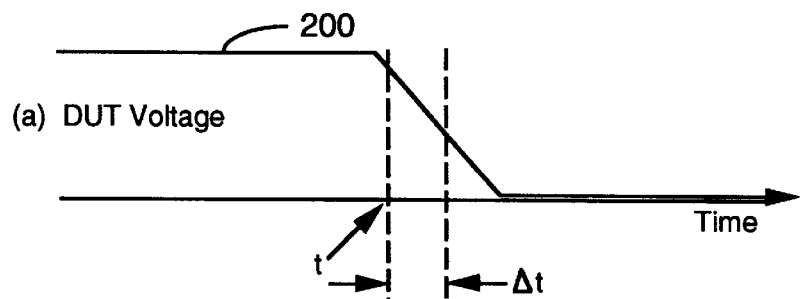
FIGS. 5A, 5B, 5C and 5D show waveforms explaining operation of the FIG. 1 apparatus.
Figure 5B:
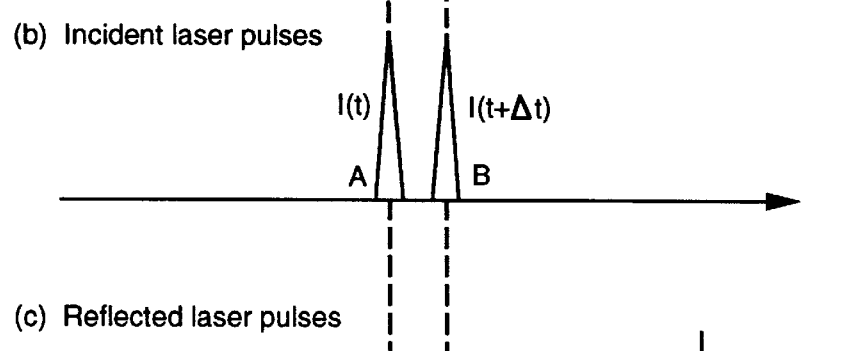

FIGS. 5A through 5D illustrate principles of operation of the differential amplitude modulation measurement apparatus shown in FIG. 2. In FIG. 5A, a voltage (signal) 200 is applied to selected terminals of the DUT. This signal of course is not the incident laser beam which is used for probing but instead is an electrical signal applied to the terminals of the DUT in order to operate it. FIG. 5b shows the two incident laser pulses A and B which are used to probe the DUT separated by time Δt. The two pulses A, B have amplitudes of I(t) and I(t+Δt) before interacting with the DUT.

Figure 5C:
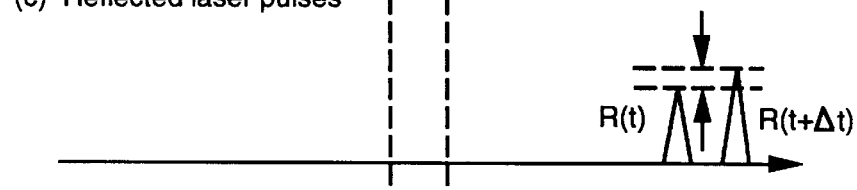

After interacting with the DUT as shown in FIG. 5C, pulses A, B respectively have amplitudes of R(t) and R(t+Δt). The difference signal (after amplification) is thus proportional to the difference between these two signal amplitudes. The difference signal is used to construct the equivalent time sampled waveform shown in FIG. 5D. The equivalent time sampled waveform is the derivative of the electrical signal applied to the terminals of the DUT.

Figure 5D:
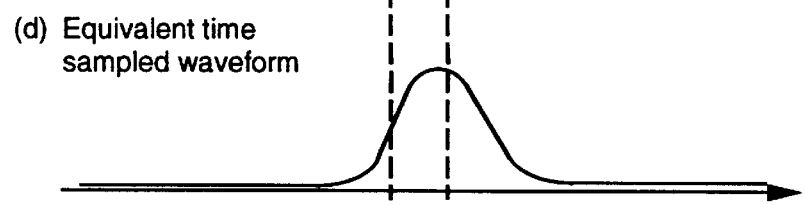

The bandwidth of the measurement, neglecting the laser pulse widths, is $1/\pi\Delta t$. Pulses A, B typically each have a width $\Delta T$ which combines with the time difference between the two pulses to produce a total effective measurement bandwidth $1/\pi(\Delta t^2 + \Delta T^2)^{1/2}$. The laser noise on the pulses A, B is canceled out because the pulses A, B are derived from the same pulse. The vibration noise induced by any motion of the DUT is canceled out within the bandwidth of $1/\pi\Delta t$. Most sources of vibration are of frequency below 10,000 Hz. The time separation between the two pulses is typically greater than 1 ns corresponding to a bandwidth of 318,000,000 Hz. Thus any vibrations in the DUT are heavily suppressed, as shown in FIG. 5D. Only the shot-noise should remain after the subtraction shown in FIG. 5C.

Figure 6A:
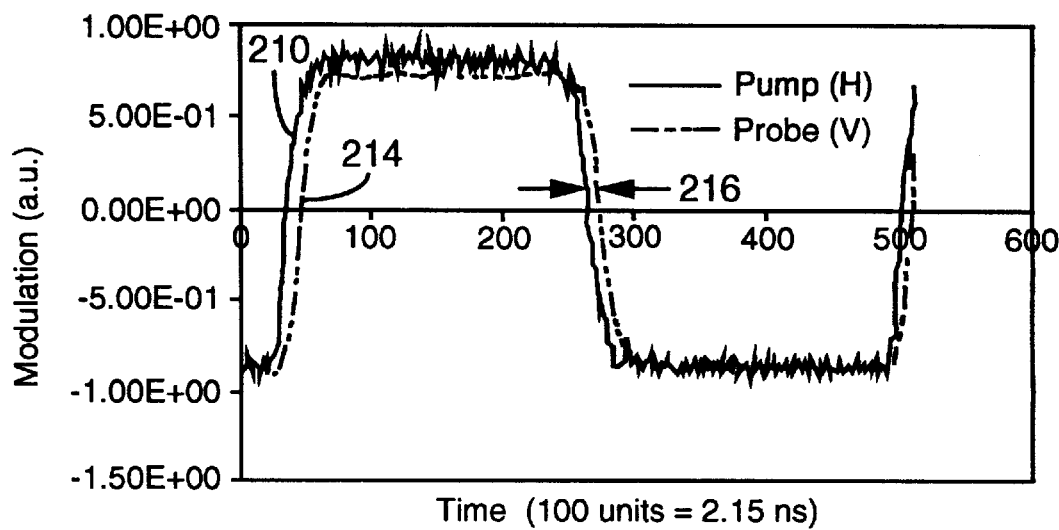
FIGS. 6A and 6B shows differential amplitude modulation measurement using the FIG. 1 apparatus.
Figure 6B:
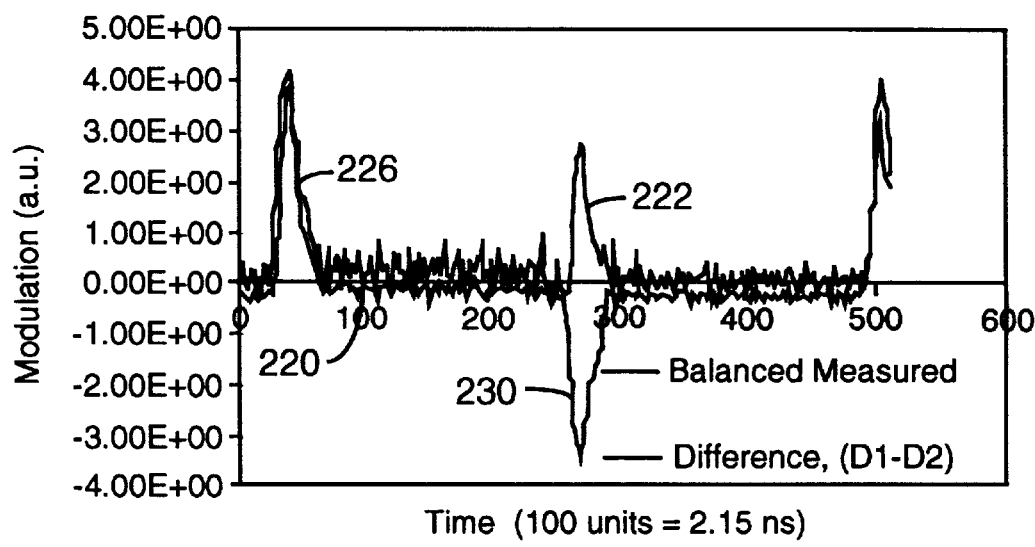

An example of differential amplitude modulation measurement using the FIG. 2 apparatus is illustrated in FIGS. 6A and 6B. In FIG. 6A the solid trace 210 is a signal representing detection of the first pulse A. The dashed trace 214 is a similar signal resulting from the second pulse B. The time delay 216 between the two pulses A, B is approximately 100 ps. Pulses A and B have orthogonal polarization which are horizontal and vertical respectively as shown.

In FIG. 6B, the solid trace 220 is the balanced (difference) signal obtained when the photo currents from the two detectors D1, D2 of FIG. 2 are electrically subtracted from each other. This balanced signal 220 is similar to the derivative of the electrical signal applied to the DUT, as in the example depicted in FIG. 5D. Peaks in the trace 222 correspond to the voltage transitions in the DUT. For comparison, the trace 226 is a result of subtracting the two traces 210 and 214 in FIG. 6A using a computer to process the signals. The opposite sign of a digitally subtracted peak 230 compared to the measured difference signal 222 results because the apparatus measures only detected power (absolute power), not the sign of the signal.

Two equal amplitude pulses must interact differently with the DUT for the difference signal to be nonzero. The interactions with the DUT may differ due to a time delay between the two pulses, as described above, or they may differ intrinsically. An intrinsic difference in interactions could be due to polarization or wavelength dependence, for example. Polarization dependent interactions can be exploited by polarizing the two pulses differently before they interact with the DUT. Wavelength dependent interactions can be exploited by wavelength shifting at least one of the pulses, to provide pulses of different wavelength, before the pulses interact with the DUT.

If the interaction strength of the laser beam with the DUT were dependent on the laser beam polarization relative to electric fields (or some other defining axes) in the DUT, then the interaction with the DUT of two pulses A, B with orthogonal polarization would be different. For example, two pulses of equal amplitude and orthogonal polarization interacting with the DUT at the same time ($\Delta t=0$) would be reflected with different amplitudes if the interactions were polarization dependent, generating a nonzero difference signal. This nonzero difference signal would vary in time with the voltage waveform applied to the DUT. In contrast, two pulses of equal amplitude, orthogonal polarization, and $\Delta t=0$ would be reflected with the same amplitude if the interactions were not polarization dependent, generating a difference signal of zero.

In the case of polarization dependent interactions, the difference signal from two pulses of equal amplitude and orthogonal polarization interacting with the DUT would be similar to the signal from one pulse alone but reduced in magnitude. This difference signal is closer to the voltage waveform applied to the DUT then it is to the derivative of the voltage waveform, particularly for $\Delta t \sim 0$. If the interactions of the laser pulses with the DUT were very different in two orthogonal directions of polarization, then by choosing these directions for the polarization of two pulses, and choosing $\Delta t=0$, a voltage waveform could be obtained directly from the difference signal. Laser and vibration noise will cancel out and the shot-noise limit will be achieved.

Noise cancellation can be facilitated by choosing the amplitudes of the two orthogonally polarized pulses so that the power in the two detectors D1, D2 is approximately equal. This suggests use of more power in the pulse that has the stronger interaction with the DUT. However, if the laser beam has some invasive effect on the semiconductor material of the DUT, such as significant electron-hole pair production, then the differential signal will have a larger contribution from the invasive effect when the power of the two pulses at the semiconductor in the DUT is unequal compared to the case when it is equal. Such invasive effects are often negligible.

The interaction of two orthogonally polarized pulses with the DUT may be rendered insensitive to polarization effects by converting linear polarization to circular polarization. The interaction of circularly polarized pulses with the DUT is the average of all directions of linear polarization. For example, placing an optional quarter wave plate 184 in front of the DUT converts the polarization of the two pulses from orthogonal linear polarizations into circular polarizations with opposite helicity. Pulses reflected from the DUT pass a second time through the quarter wave plate, resulting in orthogonal linear polarizations rotated by 90° degrees. As has already been described, the two reflected pulses could be spatially separated by a polarizing beam splitter.

If the DUT or any optical element in the laser beam path (between the generation of the two linear and orthogonal polarized pulses and the DUT) were birefringent, then the incident linear polarization would become elliptically polarized instead of a circularly polarized at the DUT downstream of the quarter wave plate. The interaction of the laser pulses with the DUT would still be dependent on the incident polarization. One way to eliminate the polarization sensitivity is to use a variable wave plate in front of the DUT in place of quarter wave plate 184. By adjusting the variable wave plate, it is possible to compensate for birefringence in the system to make the laser polarization circular at the DUT and thus avoid effects of orthogonal polarization.

This disclosure is illustrative and not limiting: Further modifications will be apparent to one skilled in the art in light of this disclosure and are intended to fall within the scope of the appended claims.

We claim:

1. A method of detecting electrical activity in a semiconductor device, comprising the acts of:
   providing a first light pulse;
   dividing the first light pulse into two pulses;
   directing the two pulses onto the semiconductor device;
   separating the two pulses spatially after they interact with the semiconductor device;
   detecting each of the two separated pulses; and
   determining a difference between the two detected pulses.

2. The method of claim 1, wherein the first light pulse is provided from a laser.

3. The method of claim 2, wherein the laser is a mode-locked laser.

4. The method of claim 1, wherein the two pulses are directed along the same path onto the semiconductor device.

5. The method of claim 1 wherein the act of directing the two pulses onto the semiconductor device comprises propagating the two pulses through the semiconductor device.

6. The method of claim 1 wherein directing the two pulses onto the semiconductor device comprises circularly polarizing the two pulses with opposite helicity before they interact with the semiconductor device.

7. The method of claim 1, wherein a time delay is provided between the two pulses before directing the two pulses onto the semiconductor device.

8. The method of claim 7, wherein the act of dividing includes mechanically varying the time delay.

9. The method of claim 1, wherein the act of dividing includes directing the first pulse onto a linear polarizer, whereby the two pulses are provided with orthogonal linear polarizations, and further comprising the act of equalizing an amplitude of the two pulses.

10. The method of claim 1, wherein at least one of the two pulses is wavelength shifted before directing the two pulses onto the semiconductor device, such that the two pulses have different wavelengths.

11. The method of claim 1, further comprising the acts of:
    amplifying the difference; and
    converting the amplified difference to a digital signal.

12. The method of claim 1, further comprising the acts of:
    moving a position on the semiconductor device on which the two pulses are incident; and
    detecting the two pulses at each of a plurality of positions on the semiconductor device.

13. The method of claim 1 further comprising the acts of:
    further dividing the two pulses to provide at least two additional pulses, prior to directing the two pulses onto the semiconductor device;
    directing the additional pulses along a reference path, thereby providing reference pulses; and
    combining each of the two pulses with at least one of the reference pulses, after the two pulses interact with the semiconductor device and before detecting each of the separated pulses, such that each of the two pulses overlaps at least one of the reference pulses in space and time, and such that the act of detecting each of the separated pulses comprises detecting the separated pulses combined with the reference pulses.

14. The method of claim 13 further comprising the act of adjusting the length of the reference path with a feedback loop to maintain the overlap in time of the two pulses with the reference pulses.

15. An apparatus for detecting electrical activity in a semiconductor device, comprising:

a source of a light pulse;

a splitter onto which the light pulse is incident, whereby the light pulse is split into two pulses;

a support for the semiconductor device onto which the two pulses are incident;

a second splitter onto which the pulses are incident after interacting with the semiconductor device, whereby the pulses are spatially separated;

first and second detectors arranged to each detect one of the two separated pulses; and a subtractor coupled to the first and second detectors.

16. The apparatus of claim 15, wherein the source is a laser.

17. The apparatus of claim 16, wherein the laser is a modelocked laser.

18. The apparatus of claim 15, wherein the two pulses are directed along the same path onto the semiconductor device.

19. The apparatus of claim 15, wherein the two pulses are directed through the semiconductor device.

20. The apparatus of claim 15, further comprising a wave plate whereby the two pulses incident on the semiconductor device are made circularly polarized with opposite helicity.

21. The apparatus of claim 15, further comprising a delay path to introduce a time delay between the two pulses.

22. The apparatus of claim 15, wherein the splitter onto which the light pulse is incident is a polarizing splitter, whereby the two pulses are provided with orthogonal linear polarizations.

23. The apparatus of claim 15, further comprising:

an amplifier coupled to the subtractor; and an analog to digital converter coupled to an output terminal of the analog to digital converter.

24. The apparatus of claim 15, further comprising a mechanism coupled to move the support relative to the pulses.

25. The apparatus of claim 15, further comprising an interferometer located in an optical path between the splitter and the support, the interferometer comprising a reference arm with a reference path length.

26. The apparatus of claim 25, further comprising a feedback loop for adjusting the reference path length.

* * * * *